United States Patent [19]
Blum et al.

[11] Patent Number: 5,190,792
[45] Date of Patent: Mar. 2, 1993

[54] HIGH-THROUGHPUT, LOW-TEMPERATURE PROCESS FOR DEPOSITING OXIDES

[75] Inventors: Joseph M. Blum, Yorktown Heights; Kevin K. Chan, Staten Island; Robert C. McIntosh, Bronx; Zeev A. Weinberg, White Plains, all of N.Y.

[73] Assignee: International Business Machines Corporation, Armonk, N.Y.

[21] Appl. No.: 413,357

[22] Filed: Sep. 27, 1989

[51] Int. Cl.$^5$ .......................... B05D 3/12; C23C 16/00
[52] U.S. Cl. .................................. 427/560; 427/240; 427/255; 427/255.3; 427/294
[58] Field of Search ...................... 427/307, 57, 255.3, 427/255, 294, 240; 437/228, 238

[56] References Cited

U.S. PATENT DOCUMENTS

| | | | |
|---|---|---|---|
| 2,962,394 | 11/1960 | Andres | 117/213 |
| 3,309,760 | 3/1967 | Reznick et al. | 29/155.5 |
| 3,426,422 | 2/1969 | Deal | 29/571 |
| 3,447,238 | 6/1969 | Heynes et al. | 29/590 |
| 3,486,951 | 12/1969 | Norby | 148/188 |
| 3,523,819 | 8/1970 | Tokuyama et al. | 117/213 |
| 4,324,841 | 4/1982 | Huang | 428/457 |
| 4,371,587 | 2/1983 | Peters | 437/238 |
| 4,419,385 | 12/1983 | Peters | 437/197 |
| 4,692,344 | 9/1987 | Kaganowicz et al. | 427/39 |
| 4,708,884 | 11/1987 | Chandross et al. | 427/39 |
| 4,737,379 | 4/1988 | Hodgens et al. | 437/234 |

OTHER PUBLICATIONS

J. Lee and C. Hu, "Low-Pressure Chemical Vapor Deposited Oxide Process for MOS Device Application," Dept. of Electrical Engineering and Computer Sciences, Univ. of Calif., Berkeley, Calif. 94720, 1988 Symposium on VLSI Technology (5/10-13).
B. R. Bennett, J. P. Lorenzo, K. Vaccaro and A. Davis, "Low Temperature Pyrolytic Deposition of High Quality $SiO_2$," *J. Electrochem Soc.: Solid-State Science and Technology*, vol. 134, No. 10 (Oct. 1987).
J. Batey and E. Tierney, "Low-Temperature Deposition of High-Quality Silicon Dioxide by Plasma-Enhanced Chemical Vapor Deposition," *J. Appl. Phys.*, 60 (9), pp. 3136–3145 (Nov. 1, 1986).
Richard S. Rosler "Low Pressure CVD Production Processes for Poly, Nitride, and Oxide". Solid State Technology, Apr. 1977 pp. 63–70.
William A. Brown and Theodore I. Kamins. "An Analysis of LPCVD System Parameters for Polysilicon, Silicon Nitride and Silicon Dioxide Deposition". Solid State Technology, Jul. 1979, pp. 51–57 & 84.
Werner Kern and David A. Puotinen "Cleaning Solutions Based on Hydrogen Peroxide for use in Silicon Semiconductor Technology". *RCA Review* Jun. 1970, pp. 187–206.
Boyer et al. "Laser Photodeposition of Silicon Oxides and Silicon Nitrides" May 1982, *Extended Abstracts*, vol. 82-1 pp. 102–103.
Cobianu et al., "A Theoretical Study of the Low-Temperature Chemical Vapor Deposition of $SiO_2$ Films", Sep. 1983, *J. Electrochem. Soc.: Solid-State Science and Technology*, vol. 130, No. 9, pp. 1888–1893.
J. R. Monkowski et al., "Failure Mechanism In MOS Gates Resulting From Particulate Contamination", Mar.-Apr., 1982, *20th Annual Proceedings Reliability Physics*, San Diego, Calif., pp. 244–248.
Y. Avigal et al., "A New Method For Chemical Vapor Deposition of Silicon Dioxide", Aug. 8, 1974, *Journal of the Electrochemical Society*, vol. 121 No. 8, pp. 1103–1107.
H. Mishima et al. "Particle-Free Wafer Cleaning and Drying Technology", Aug., 1989, *IEEE Transactions on Semiconductor Manufacturing*, vol. 2, No. 3, pp. 69–75.
G. Gould et al. "The Influence of Silicon Surface Cleaning Procedures On Silicon Oxidation", Apr. 1987, *Journal of the Electrochemical Society* vol. 134, No. 4 pp. 1031–1033.

*Primary Examiner*—Janyce Bell
*Attorney, Agent, or Firm*—Bernard E. Shay; Robert M. Trepp

[57] ABSTRACT

The present invention relates to a low-pressure chemical vapor deposition (LPCVD) process for depositing silicon dioxide. In particular, the present invention describes a process involving a pre-cleaning step in which all impurities are removed from the substrate followed by a LPCVD step performed at temperatures of between 200° C. and 300° C. The process of the present invention is intended to replace higher temperature LPCVD and thermal processes for depositing silicon dioxide.

More particularly, the present invention involves a process in which a substrate is washed using a predetermined cleaning process. The substrate is then exposed to a dilute hydrofluoric acid solution which removes native oxide and contaminants from the surface. Next, the substrate is rinsed with, for example, de-ionized water or ultra-clean water to remove any hydrofluoric acid or other residue from the previous process steps. A layer of material, for example, silicon dioxide, is then deposited using a low-pressure chemical vapor deposition process in which the gas flow comprises silane, oxygen and nitrogen at temperatures below 300° C. Oxide qualities approaching those of thermally grown oxides having been achieved.

17 Claims, No Drawings

HIGH-THROUGHPUT, LOW-TEMPERATURE PROCESS FOR DEPOSITING OXIDES

The present invention relates, in general, to a high-throughput, low-temperature process for depositing oxide materials and, more particularly, to a high-throughput process for depositing high-quality silicon dioxide at temperatures of about 300° C. or below.

BACKGROUND OF THE INVENTION

In making integrated circuits for use in computers and other electronic devices, it is often desirable to deposit a thin layer of oxide material on a substrate. However, deposition of semiconductor materials by conventional techiques is frequently a lengthy process in which the ultimate quality of the deposited materials depends on a number of process parameters, some of which are difficult to control. Generally, conventional deposition processes comprise a pre-preparation step and a material deposition step.

Cleaning is important because it prepares the substrate surface for the subsequent material deposition step. If the substrate surface is not properly prepared, the interface between the substrate and the deposited material may include unwanted contaminates. In addition, if the substrate is not properly cleaned, the deposited material may not properly adhere to the substrate. Either of these conditions may result in undesirable electrical characteristics at the interface between the deposit and the substrate. The electrical and mechanical characteristics of the deposited material itself may also be detrimentally affected by deposition over an improperly cleaned surface. One conventional preoxidation cleaning technique is described in "Cleaning Solutions Based on Hydrogen Peroxide for Use in Silicon Semiconductor Technology," by Werner Kern and David Protinea RCA Review, June 1970, p. 187, which is hereby incorporated by reference.

The substrate over which the $SiO_2$ is to be deposited is typically a semiconductor material or passivation material and may include a number of materials at its surface, for example, where the $SiO_2$ is being deposited over a number of devices on an integrated circuit. In addition, the surface of the substrate may be uneven, including mesa structures, trenches and other variations.

The quality and characteristics of the deposited material are a function of the nature of the material deposition step in addition to the cleaning step. A number of techniques have been used in the art to deposit semiconductor material over a substrate, including chemical vapor deposition and plasma deposition. Each of these conventional techniques has advantages and disadvantages for the deposition of semiconductor materials. For example, plasma deposition techniques are useful for depositing high-quality oxides such as $SiO_2$ at low temperatures. Chemical vapor deposition (CVD), on the other hand, is useful for processing large numbers of wafers. However, CVD deposition normally requires extremely high temperatures to deposit high-quality oxides, while plasma techniques are normally not adaptable to processing large quantities of wafers.

A high-temperature (950° C.) plasma-enhanced chemical vapor deposition process including a pre-treatment step is described in U.S. Pat. No. 3,447,238 to Heynes et al. The pre-treatment described includes rinsing with a 10:1 solution of DI water and HF acid followed by a 10 minute hot (100° C.) nitric acid treatment.

In U.S. Pat. No. 3,486,951 to Morby et al. the oxide layer is formed by oxidation at 1100° C. for 5 minutes. A high quality oxide is obtained by cleaning the wafer with a chromium trioxide and sulfuric acid solution, followed by a dip in a HF acid solution. Finally, the wafer is subjected to a nozzle spray of methyl alcohol and orthophosphoric acid.

"Low Pressure Chemical Vapor Deposited Oxide Process for MOS Device Application," Jack Lee and Chenming Hu, presented at the Symposium on VLSI Technology held in San Diego, May 10–13, 1988, describes a low-pressure chemical vapor deposition process (LPCVD) which operates at temperatures from 400° to 450° C. The process disclosed utilizes a densification step in nitrogen and a short annealing step in oxygen at 950° C.

The quality of a deposited oxide may be determined by measuring a number of "figures of merit". These figures of merit are electrical characteristics of the oxide which provide some indication of how an electronic device (e.g., an MOS field effect transistor) using that oxide will perform. Some of the more widely recognized figures of merit include breakdown voltage, interface trap density, oxide charge (flatband voltage) and interface minority carrier generation-lifetime. Normally a high-quality oxide layer would have a breakdown field of greater than approximately 8.0 megavolts per centimeter (MV/cm). Further, a high-quality oxide layer would have a midgap interface trap density of less than approximately $4 \times 10^{10}$ traps per electronVolt-centimeter squared ($eV \cdot cm^2$). Finally, a high-quality oxide deposition would be expected to have an interface minority carrier generation-lifetime of more than approximately 40 microseconds in the silicon near the interface.

In depositing $SiO_2$ as in the present invention, it is known that conformality is also a figure of merit. Conformality is a measure of the degree to which the deposited oxide conforms to the surface of the substrate. It may be expressed as a ratio of the thickness of the deposited layer in a trench to the thickness on a level surface. The thickness in the trench may be measured either at the midpoint, on the sidewalls or at the trench bottom. If the measurement is made at the trench midpoint, a conformality of 80% or better is desired. TEOS may be used to have a high degree of conformality, but introduces carbon and is therefore disadvantageous. Also, it is deposited at higher temperatures.

Oxides having acceptable figures of merit may be grown using high-temperature thermal oxidation. The process of growing oxides at high temperatures is a thermal process in which the oxide is grown by oxidation of the substrate, as opposed to chemical vapor deposition in which the oxide is deposited by a chemical reaction between the gas species (e.g., silane and oxygen) at the substrate surface. Thermal oxidation is disadvantageous in certain applications as the high temperatures required produce undesirable side effects such as junction migration and changes in implanted or diffused impurity profiles. High temperatures may also result in the introduction of unwanted defects or contaminants. In addition, some processing materials (e.g., aluminum) cannot tolerate high temperatures.

The drive toward low-temperature processing to produce smaller, shallower device structures has placed severe limitations on the formation of insulators in silicon technology. To overcome these limitations, researchers have recently begun investigating alternatives to high-temperature thermal oxides. Thus, it would be advantageous to provide a low-temperature (e.g., 200°-300° C.) process for depositing high-quality $SiO_2$ films on a silicon substrate and achieving the quality of thermally grown $SiO_2$ films.

Other processes for depositing high-quality semiconductor materials at lower temperatures include plasma-enhanced chemical vapor deposition. Plasma deposition is a form of chemical vapor deposition in which a plasma is formed in the gas to enhance its deposition characteristics. These processes are normally low-throughput processes which are not readily adaptable to high volume manufacturing, resulting in a trade-off between oxide quality and manufacturability (i.e., cost). However, because the plasma must be in contact with each substrate, it is not possible to process more than a limited number of substrates and, thus, this is a very low-throughput process. Plasma deposition may also result in radiation damage to some sensitive materials. One such process is described by J. Batey and E. Tierney in "Low-Temperature Deposition of High Quality Silicon Dioxide by Plasma Enhanced Chemical Vapor Deposition," *Journal of Applied Physics*, 60 (9), Nov. 1, 1986, at p. 3136.

Standard chemical vapor deposition is advantageous because it may be accomplished at temperatures well below the temperatures required for thermally deposited oxides, while retaining the high throughput of thermal deposition. However, conventional high-throughput chemical vapor deposition processes adapted to deposit oxides at low temperatures have not, to this point, proved capable of depositing thermal like high-quality oxides. (See, for example, Rosler *Low Pressure CVD Production Process for Poly Nitride and Oxide*. Solid State Technology, April 1977, pp. 63-70.)

It is known that oxides may be deposited by chemical vapor deposition (CVD) at low temperatures (e.g., in the 400°-500° C. range). Oxides deposited by these low-temperature CVD techniques are well-known and are generally referred to as low-temperature oxides (LTO). The problem with these low-temperature oxides has been the low quality of the oxide compared with thermally grown oxides. To deposit $SiO_2$ by CVD from silane ($SiH_4$) and oxygen ($O_2$), a temperature of 450° C. or greater is generally required to achieve acceptable quality. However, even at these temperatures, the quality of deposited $SiO_2$ has not come close to the quality of thermally grown oxides.

SUMMARY OF THE INVENTION

The present invention relates to a low-pressure chemical vapor deposition (LPCVD) process for depositing silicon dioxide. In particular, the present invention concerns a process involving a pre-cleaning step in which impurities are removed from the substrate followed by a LPCVD step performed at temperatures which can be as low as between approximately 200° C. and 300° C. Preferred processes of the present invention can be used to replace higher temperature LPCVD and thermal processes for depositing silicon dioxide.

More particularly, the present invention involves a pre-clean step in which a substrate is washed using a predetermined cleaning process (e.g., a pre-oxidation clean). The substrate is then dipped in a dilute hydrofluoric acid solution which removes native oxide and contaminants from the surface. Next, the substrate is rinsed with, for example, de-ionized water or ultra-clean water to remove any hydrofluoric acid or other residue from the previous process steps. Finally, a layer of silicon dioxide is deposited using a low-pressure chemical vapor deposition process in a gas flow which comprises silane, oxygen and nitrogen at temperatures of 300° C. or less.

Preferred embodiments of the present invention provide a process for depositing high-quality silicon dioxide at temperatures of approximately 300° C. or less.

The process of the present invention preferably provides for depositing high-quality silicon dioxide at temperatures below approximately 300° C. in a low-pressure chemical vapor deposition regime.

Preferred embodiments of the present invention permit a layer of silicon dioxide to be deposited using an LPCVD process at temperatures below approximately 300° C. wherein the deposited oxide preferably has the following characteristics: a breakdown field of more than about 8 MV/cm and a midgap interface trap density ($D_{it}$) of less than about $5 \times 10^{10}$ interface states per eV-$cm^2$.

The present invention involves a dual process which results in an excellent quality silicon dioxide from a low-temperature, low-pressure chemical vapor deposition (CVD) process.

DETAILED DESCRIPTION OF PREFERRED EMBODIMENTS

According to the present invention, the deposition process is divided into a pre-deposition clean and a very low-temperature (less than approximately 300° C.) oxide (VLTO) deposition.

In general, a pre-deposition clean according to the present invention comprises a pre-oxidation clean which includes at least an Ammonium Hydroxide ($NH_4OH$) rinse, followed by an Hydrochloric Acid (HCL) rinse.

In the $NH_4OH$ rinse, the $NH_4OH$ will typically be in a solution including Hydrogen Peroxide ($H_2O_2$) and water ($H_2O$). In the HCl rinse, the HCl will typically be in a solution including $H_2O_2$ and $H_2O$.

It will be apparent to those skilled in the art that, if the substrate on which silicon dioxide is to be deposited according to the present process is sufficiently clean, the previous step may not be necessary.

In various embodiments of the present invention, a dilute Hydrofluoric Acid (HF) dip may precede both the $NH_4OH$ and HCl rinses, follow the $NH_4OH$ and HCl rinses, follow the $NH_4OH$ rinse and precede the HCl rinse or follow both the $NH_4OH$ and HCl rinses.

The pre-deposition clean further comprises a rinse in dilute HF which follows the pre-oxidation clean and immediately precedes insertion of the substrate in the deposition chamber. Since the purpose of the HF rinse is to eliminate all of the native oxide from the surface of the wafer prior to depositing an oxide according to the present invention, it should be performed immediately prior to inserting the substrate into the deposition chamber. That is, the HF dip should be performed with a minimum time, to prevent the formation of native oxide or adsorption of hydrocarbons prior to inserting the substrate into the deposition chamber.

Once the pre-deposition clean is accomplished, the substrate is inserted into a deposition chamber within approximately five minutes. This deposition chamber will typically include a quartz tube in which boat(s) hold the substrate in place. In a preferred embodiment of the present invention, the deposition chamber will be extremely clean. One way to clean such a system is to use what is known as a white etch. In a white etch, the chamber is exposed to a mixture of HF and nitric acid with a concentration of 1:4. The white etch is followed by a rinse. To adequately maintain the deposition chamber, it may be advisable to use a dedicated chamber. In addition, the chamber may be maintained at a pressure of more than approximately 50 microns of mercury between deposition runs as a means of preventing contamination and preventing back diffusion of vacuum pump oil.

Finally, in a preferred embodiment the deposition is accomplished in a temperature and pressure regime which is designed for a deposition rate of approximately 25 Å per minute, preferably between 20 and 30 Å per minute. The temperature should preferably be in the range from 100° C. to 300° C., while the pressure should be in range from 0.4 Torr to 1.4 Torr.

One preferred embodiment of the invention is a two step process. One is an oxidation cleaning process and two, a predeposition CVD process. The pre-oxidation step includes a first de-ionized water rinse followed by a dip in HF acid for approximately 75 seconds, followed by a second de-ionized water rinse. The HF acid dip and second de-ionized water rinse are optional, and may be omitted if desired. The pre-clean step includes a second dip in a solution of ammonium hydroxide, hydrogen peroxide and de-ionized water ($NH_4OH:H_2O_2:H_2O$) at a concentration ratio of 1:1:5 with ultrasonic agitation at about 60° C. for approximately 5 minutes. The second dip can be followed by a third de-ionized water rinse of approximately 5 minutes. The pre-clean step also includes a third dip in a solution which comprises hydrochloric acid, hydrogen peroxide and de-ionized water ($HCl:H_2O_2:H_2O$) at an approximate concentration ratio of 1:1:5 with ultrasonic agitation at about 60° C. for about 5 minutes. The third dip is followed by a fourth de-ionized water rinse lasting approximately 5 minutes. Finally, the substrate is subjected to a last rinse in de-ionized water, sprayed with hot nitrogen and spun dry. The pre-clean described in the June 1970 *RCA Review* (referenced previously) would also be suitable.

The second step is a pre-CVD surface treatment and is comprised of dilute hydrofluoric acid (HF) dip. Preferably, the hydrofluoric acid solution comprises about ten parts water to about one part hydrofluoric acid (10:1). The substrate may be dipped for approximately ten seconds. A suitable dip solution is PARTICAL-LO ® 10:1 HF, which is manufactured by General Chemical Corporation. It is desirable that the dip solution be low-particle grade, that is, it should be a VLSI-grade dip solution having a particulate level of approximately 0.1 ppm or less. The final step in this procedure is a de-ionized water rinse. The purpose of the rinse is to remove any remaining HF acid droplets. De-ionized water is the preferred rinse solution. Other suitable rinse solutions such as ultra-clean de-ionized water will occur to one skilled in the art. The rinse may be approximately 15 seconds. In certain applications the final rinse may not be necessary.

The de-ionized water for the process steps of the present invention should have a resistivity of at least about 18 megohm-cm with no greater than about 50 ppb (parts per billion) total organic content. Particles larger than about 0.02 microns should be removed from the de-ionized water by filtration.

The oxide may then be deposited on the cleaned wafer. The deposition according to the present invention preferably utilizes a single wall, low-pressure chemical vapor deposition (LPCVD) chamber such as a quartz tube. One suitable furnace for the LPCVD deposition of $SiO_2$ is a single hot-wall furnace.

In one preferred embodiment according to the present invention, the components of the deposition gas are silane ($SiH_4$), oxygen and nitrogen. In this preferred process, the nitrogen is essentially passive and performs the function of maintaining the desired atmospheric pressure during deposition. The reactive gases are oxygen and silane. The silane of silicon in the chemical reaction with oxygen to form $SiO_2$.

Suitable silane is preferably a VLSI-grade silane capable of growing epitaxial silicon with a resistivity of greater than approximately 500 ohm-cm (N-type). The oxygen is preferably purified to reduce water and hydrocarbon content to below approximately 0.1 ppm.

Deposition of the silicon dioxide may be accomplished using the following set of parameters. The silane ($SiH_4$) may preferably have a flow rate in the range of from about 20 to about 40 sccm (standard cubic centimeters/minute). A flow rate of about 30 sccm is particularly preferred. The oxygen ($O_2$) may preferably have a flow rate in the range of from about 20 to about 120 sccm. An oxygen flow rate of about 25 sccm is particularly preferred. The nitrogen ($N_2$) may preferably have a flow rate in the range of from about 50 to about 300 sccm. A nitrogen flow rate of about 150 sccm is particularly preferred.

The flow rates described herein are in a deposition chamber having a diameter of about 190 mm (i.e., a cross-sectional area of about 28,353 $mm^2$). It will thus be apparent to those skilled in the art that the sccm flow rates must be adjusted proportionately for deposition chambers having different cross sectional areas.

Since adjustment of the flow rates of the gas components will change the concentration ratios of one gas to the other, it is also necessary to maintain appropriate ratios. In one embodiment, the acceptable gas pressure ratio of silane to oxygen may be from about 0.9 to about 1.3. The nitrogen is preferably in the range of from approximately 50 to 80% of the total gas flow. The concentration of nitrogen may also be adjusted to control the deposition rate and the film uniformity.

While the pressure of the deposition chamber during deposition is a function of the various flow rates, it is advantageous to maintain the chamber at a pressure as low as possible. Preferably, the total pressure in the chamber is in the range of from about 0.4 to about 1.4 Torr. A total pressure of approximately 1.3 Torr is particularly preferred.

An important characteristic of the present invention is the temperature of the substrate. The substrate preferably has a temperature in the range of from approximately 200° C. to approximately 300° C. A substrate temperature of approximately 300° C. is particularly preferred.

In one particularly preferred embodiment, the silane ($SiH_4$) has a flow rate of approximately 30 sccm; the oxygen ($O_2$) has a flow rate of approximately 25 sccm; the nitrogen ($N_2$) has a flow rate of approximately 150 sccm. The deposition pressure is about 1.3 Torr. The deposition temperature is about 300° C.

In one preferred embodiment of a process according to the present invention, silicon wafers are subjected to three nitrogen-purge/vacuum cycles during which the reaction tube is filled with nitrogen and purged while the temperature of the wafer surface is raised to the deposition temperature of about 300° C. The nitrogen purges are used to minimize contamination of the wafer surface. Reactive gases comprising an oxygen contributor and a silicon contributor are then injected into the chamber and $SiO_2$ is deposited on the wafers. The deposition time and pressure may be changed without affecting the quality of the oxide. For example, a 10-minute deposition using this process should yield approximately 22 nm (220 Å) of $SiO_2$ having a thickness uniformity of +/−3.5% across the wafer. If the pressure is reduced to about 0.4 Torr, a 15-minute deposition should yield approximately 22.5 nm (225 Å) of $SiO_2$ having a thickness uniformity of +/−3.2% across the wafer. The quality of the oxide deposited at approximately 1.3 Torr is substantially the same as the quality of the oxide deposited at approximately 0.4 Torr.

Following this deposition, in the preferred embodiment, the etch rate of the oxide would be approximately 1900 Å per minute in a buffered oxide etchant (such as a solution of approximately 9 parts saturated amonium fluoride ($NH_4F$) in water to approximately one part hydrofloric acid), at a temperature of approximately 23° C. In order to reduce the etch rate, it is necessary to anneal the oxide at between 500° and 550° C. for 30 minutes in an inert gas environment such as nitrogen. The etch rate will be reduced by this anneal to an etch rate of approximately 1450 Å per minute in the buffered oxide etchant solution described above. It was also found that this anneal improves the minority carrier lifetime.

In order to characterize the quality of an oxide layer deposited on a silicon wafer and its interface with the silicon, MOS capacitors are formed on the oxide by evaporation of aluminum electrodes. These structures are subjected to a conventional post-metalization anneal (e.g., annealing at about 400° C. for about 20 minutes in a mixture of about 10% hydrogen and about 90% nitrogen) to reduce interface trap density.

As was previously discussed, the quality of the deposited oxide layer may be characterized by certain "figures of merit". Oxides deposited according to the process of the present invention have achieved figures of merit which approached thermally grown oxides (i.e., oxides grown at temperatures above about 900° C.). Specific examples of deposition runs and results are listed below.

In these experimental runs, the wafer was first dipped in a de-ionized water rinse followed by an approximately 75-second dip in dilute HF acid, and a second de-ionized water rinse. This was followed by a second approximately 5-minute dip in a solution of ammonia, hydrogen peroxide and de-ionized water with a concentration ratio of about 1:1:5 ($NH_4OH:H_2O_2:H_2O$). While submersed in this solution, the substrate was subjected to an ultrasonic agitation at about 60° C., followed by a third de-ionized water rinse for approximately 5 minutes. A third dip in a solution of hydrochloric acid, hydrogen peroxide and de-ionized water in a concentration ratio of about 1:1:5 ($HCl:H_2O_2:H_2O$) with ultrasonic agitation at about 60° C. for approximately 5 minutes was followed by a fourth de-ionized water rinse lasting approximately 5 minutes. Finally, the wafer was subjected to a rinse and dry cycle. The rinse and dry cycle may include a de-ionized water rinse and a hot nitrogen spray and a spin dry.

Just prior to deposition the wafer was dipped in dilute HF for 15 seconds, followed by a 10 second dip in de-ionized water. The wafer was then blown dry in nitrogen. During deposition of the $SiO_2$, the silane ($SiH_4$) had a flow rate of about 30 sccm. The oxygen ($O_2$) had a flow rate of about 25 sccm. The nitrogen ($N_2$) had a flow rate of about 150 sccm. The temperature in these runs varied between about 200° C. and about 300° C. The pressure was varied between about 0.4 and about 1.3 Torr.

The wafers were subsequently subjected to a pre-metalization anneal in an environment of essentially 100% nitrogen at a temperature of about 550° C. Aluminum electrodes were then evaporated onto the $SiO_2$ surface in a vacuum environment at between approximately 25° C. and approximately 70° C. Aluminum was also evaporated on the back side of the wafer (i.e., the side opposite the $SiO_2$ deposition) to improve the backside contact. The back side aluminum was deposited in a vacuum environment at temperatures from about 25° C. to about 70° C. Finally, the substrates were subjected to a post-metalization anneal in an environment of about 10% hydrogen and about 90% nitrogen at a temperature of about 400° C. for approximately 20 minutes.

In run 1, at a pressure of about 1.30 Torr and a temperature of about 300° C., an oxide deposited to a thickness of about 220 Å had a breakdown field of about 9.0 MV/cm (MegaVolts per centimeter), a minority carrier lifetime of about 50 microseconds and a midgap interface trap density ($D_{it}$) of about $3.0 \times 10^{10}$ per eV-$cm^2$.

In run 2, at a pressure of about 0.65 Torr and a temperature of about 300° C., an oxide deposited to a thickness of about 220 Å had a breakdown field of about 8.8 MV per centimeter, a minority carrier lifetime of about 63 microseconds and a $D_{it}$ of about $2.6 \times 10^{10}$ per eV-$cm^2$.

In run 3, at a pressure of about 1.3 Torr and a temperature of about 200° C., an oxide deposited to a thickness of about 200 Å had a breakdown field of about 8.5 MV per centimeter, a minority carrier lifetime of about 42 microseconds and a $D_{it}$ of about $4.5 \times 10^{10}$ per eV-$cm^2$.

In run 4, at a pressure of about 1.3 Torr and a temperature of about 300° C., an oxide deposited to a thickness of about 145 Å had a breakdown field of about 8.9 MV per centimeter, a minority carrier lifetime of about 49 microseconds and a $D_{it}$ of about $3.2 \times 10^{10}$ per eV-$cm^2$.

As the data show, the quality of the deposited $SiO_2$ approaches that of conventional thermally grown oxides which is an industrial standard of quality. In addition, the process of the invention can achieve these electrical characteristics in oxides deposited at deposition temperatures as low as about 200° C. to about 300° C.

Other advantages of the present process include excellent conformality over trenches and steps. In addition, compared with plasma deposition processes, there is essentially no radiation damage. In addition, the invention is adaptable to batch processes. Furthermore, the invention does not require the use of costly gasses such as helium.

While preferred embodiments of the present invention have been shown and described herein, it will be obvious to those skilled in the art that such embodiments are provided by way of example only. Numerous variations, changes, and substitutions will now occur to those skilled in the art without departing from the invention. Accordingly, it is intended that the invention be limited only by the spirit and scope of the appended claims.

What we claim is:

1. A process for the deposition of silicon dioxide material on a substrate comprising the steps of:
   washing said substrate;
   exposing said substrate in a dilute hydrofluoric acid solution;
   rinsing said substrate in a rinse solution;
   said steps of exposing and rinsing performed immediately prior to inserting said substrate into a deposition chamber within approximately five minutes; and
   depositing said silicon dioxide material in a hot-wall furnace in said deposition chamber using a low-pressure chemical vapor deposition process at a temperature between 200° C. and 300° C.;
   said step of washing includes the steps of:
   a first de-ionized water rinse;
   a dip in a dilute hydrofluoric acid solution;
   a second de-ionized water rinse;
   a first ultrasonic agitation in a solution of ammonia ($NH_4OH$), hydrogen peroxide ($H_2O_2$) and de-ionized water at a temperature of approximately 60° C.;
   a third de-ionized water rinse;
   a second ultrasonic agitation in a solution of hydrochloric acid HCL, hydrogen peroxide ($H_2O_2$) and de-ionized water at a temperature of approximately 60° C.;
   a fourth de-ionized water rinse;
   a final rinse; and
   a spin dry;
   said rinse solution comprises de-ionized water.

2. A low-temperature, low-pressure process for the deposition of $SiO_2$ on a substrate, said process comprising the steps of:
   washing said substrate:
   rinsing said substrate in a rinse solution;
   said step of rinsing performed immediately prior to inserting said substrate into a low-pressure chemical vapor deposition chamber within approximately five minutes; and
   depositing said $SiO_2$ in said low-pressure chemical vapor deposition chamber in a hot-wll furnace under the following conditions:
   a gas flow of a first reactive gas, a second reactive gas and a non-reactive gas;
   a pressure in the range from 0.4 Torr to 1.4 Torr; and
   a temperature in the range from approximately 200° C. to 300° C.,
   said rinse solution contains a dilute concentration of hydrofluoric acid;
   said first reactive gas is an oxygen contributor;
   said second reactive gas is a silicon contributor;
   said oxygen contributor comprises oxygen;
   said silicon contributor comprises silane;
   said step of washing includes the steps of:
   a first de-ionized water rinse;
   a dip in a dilute hydrofluoric acid solution;
   a second de-ionized water rinse;
   a first ultrasonic agitation in a first solution of ammonia ($NH_4OH$), hydrogen peroxide ($H_2O_2$) and a de-ionized water at a temperature of approximately 60° C.;
   a third de-ionized water rinse;
   a second ultrasonic agitation in a second solution of hydrochloric acid HCL, hydrogen peroxide ($H_2O_2$) and de-ionized water at a temperature of approximately 60° C.;
   a fourth de-ionized water rinse; and
   a drying step.

3. The process of claim 2, wherein
   said first solution has concentration ratios of 1:1:5 of $NH_4OH:H_2O_2:H_2O$; and said second solution has a concentration ration of approximately 1:1:5 of $HCL: H_2O_2:H_2O$.

4. A low-temperature, low-pressure process for the deposition of $SiO_2$ on a substrate, said process comprising the steps of:
   washing said substrate;
   exposing said substrate in a dilute hydrofluoric acid solution,
   rinsing said substrate in a rinse solution
   said steps of exposing and rinsing performed immediately prior to inserting said substrate into a deposition chamber within approximately five minutes; and
   depositing said $SiO_2$ in a hot-wall furnace in said low-pressure chemical vapor deposition chamber under the following conditions:
   a gas flow of a first reactive gas, a second reactive gas and a non-reactive gas;
   said first reactive gas includes oxygen;
   said second reactive gas includes silane;
   a pressure in the range from 0.4 Torr to 1.4 Torr; and
   a temperature in the range from approximately 200° C. to 300° C.,
   said deposition step is followed by the step of first annealing $SiO_2$.

5. A low-temperature, low-pressure process for the deposition of $SiO_2$ on a substrate, said process comprising the steps of:
   washing said substrate;
   rinsing said substrate in a rinse solution;
   depositing said $SiO_2$ in a low-pressure chemical vapor deposition chamber under the following conditions:
   a gas flow of a first reactive gas, a second reactive gas and a non-reactive gas;
   said first reactive gas includes oxygen;
   said second reactive gas includes silane;
   a pressure in the range from 0.4 Torr to 1.4 Torr; and
   a temperature in the range from approximately 200° C. to 300° C.,
   said deposition step is followed by the step of first annealing said $SiO_2$;
   wherein said step of first annealing is followed by the steps of:
   evaporating aluminum on said $SiO_2$; and second annealing said $SiO_2$.

6. A low-temperature, low-pressure process for the deposition of $SiO_2$ on a substrate, said process comprising the steps of:
   washing said substrate;
   rinsing said substrate in a rinse solution;
   depositing said $SiO_2$ in a low-pressure chemical vapor deposition chamber under the following conditions:
   a gas flow of a first reactive gas, a second reactive gas and a non-reactive gas;
   said first reactive gas includes oxygen;
   said second reactive gas includes silane;
   a pressure in the range from 0.4 Torr to 1.4 Torr; and
   a temperature in the range from approximately 200° C. to 300° C., said deposition step is followed by the step of first annealing said SiO$_2$;

wherein said step of first annealing includes the steps of:

heating said substrate to approximately 550° C. in an environment comprised substantially of an inert gas.

7. The process of claim 5 wherein said step of second annealing includes the steps of:

heating said substrate to approximately 400° C. in an atmosphere comprised of approximately 10 percent hydrogen and 90 percent inert gas.

8. A low-temperature, low-pressure process for the deposition of SiO$_2$ on the surface of a substrate, said process comprising the steps of:

washing said substrate;

exposing said substrate to a dilute hydrofluoric acid solution;

rinsing said substrate in a rinse solution;

said steps of exposing and rinsing performed immediately prior to inserting said substrate into a deposition chamber within approximately five minutes; and placing said substrate in a hot-wall furance in said low-pressure chemical vapor deposition chamber, causing silane, oxygen and nitrogen to flow through said deposition chamber, the total pressure in said chamber being maintained in the range of from about 0.4 Torr to about 1.4 Torr; and maintaining the temperature of said substrate in the range of from approximately 200° C. to approximately 300° C.

9. A process for depositing SiO$_2$ according to claim 8 wherein:

said total pressure is approximately 1.3 Torr.

10. A low-temperature, low-pressure process for the deposition of SiO$_2$ on the surface of a substrate, said process comprising the steps of:

washing said substrate;

exposing said substrate to a dilute hydrofluoric acid solution;

rinsing said substrate in a rinse solution;

said steps of exposing and rinsing performed immediately prior to inserting said substrate into a deposition chamber within approximately five minutes; and placing said substrate in a hot-wall furnace in said low-pressure chemical vapor deposition chamber;

causing silane, oxygen and nitrogen to flow through said deposition chamber, the total pressure in said chamber being maintained in the range of from about 0.4 Torr to about 1.4 Torr; and maintaining the temperature of said substrate in the range of from approximately 200° C. to approximately 300° C., said total pressure is approximately 1.3 Torr;

said step of washing includes the steps of a first de-ionized water rinse;

a dip in a dilute hydrofluoric acid solution;

a second de-ionized water rinse;

a first ultrasonic agitation in a solution of ammonia (NH$_4$OH), hydrogen peroxide (H$_2$O$_2$) and de-ionized water at a temperature of approximately 60° C.;

a third de-ionized water rinse;

a second ultrasonic agitation in a solution of hydrochloric and HCL, hydrogen peroxide (H$_2$O$_2$) and de-ionized water;

a fourth de-ionized water rinse;

a final rinse; and a spin dry;

said rinse solution comprises de-ionized water.

11. A process for the deposition of silicon dioxide material on a substrate comprising the steps of:

washing said substrate;

exposing said substrate in a dilute hydrofluoric acid solution;

rinsing said substrate in a rinse solution;

said steps of exposing and rinsing performed immediately prior to inserting said substrate into a deposition chamber within approximately five minutes; and depositing said silicon dioxide material in a hot-wall furnace in said low-pressure chemical vapor deposition chamber using a low-pressure chemical vapor deposition process at a temperature between 200° C. and 300° C.

12. A process for the deposition of SiO$_2$ material on a substrate comprising the steps of:

washing said substrate;

exposing said substrate in a dilute hydrofluoric acid solution;

rinsing said substrate;

said steps of exposing and rinsing performed immediately prior to inserting said substrate into a low-pressure chemical vapor deposition chamber within approximately five minutes; and depositing said SiO$_2$ in a hot-wall furnace in said low-pressure chemical vapor deposition chamber under the following conditions:

a gas flow of silane, oxygen and nitrogen;

a pressure in the range of 0.4 Torr to 1.4 Torr; and a temperature in the range of approximately 200° C. to 300° C.

13. A low-temperature, low-pressure process for the deposition of SiO$_2$ on a substrate, said process comprising the steps of:

washing said substrate;

rinsing said substrate in a rinse solution;

said step of rinsing performed immediately prior to inserting said substrate into a low-pressure chemical vapor deposition chamber within approximately five minutes; and depositing said SiO$_2$ in a hot-wall furnace in said low-pressure chemical vapor deposition chamber under the following conditions;

a gas flow of a first reactive gas, a second reactive gas and a non-reactive gas;

a pressure in the range from 0.4 Torr to 1.4 Torr; and a temperature in the range from approximately 200° C. to 300° C.

14. The process of claim 13 wherein:

said rinse solution contains a dilute concentration of hydrofluoric acid.

15. The process of claim 14 wherein:

said first reactive gas is an oxygen contributor; and said second reactive gas is a silicon contributor.

16. The process of claim 15 wherein:

said oxygen contributor comprises oxygen; and said silicon contributor comprises silane.

17. A method of depositing silicon dioxide over a substrate including the steps of:

cleaning said substrate wherein said cleaning step comprises:

exposing said substrate to a solution including $NH_4OH$; $H_2O$ and $H_2O_2$ in a concentration ratio of approximately 1:1:5;

exposing said substrate to a solution including HCl, $H_2O_2$ and $H_2O$ in a concentration ratio of approximately 1:1:5;

exposing said substrate to a solution including dilute hydrofluoric acid;

immediately inserting said substrate into a clean chemical deposition chamber where said chemical vapor deposition chamber has been cleaned using a white etch process including hydrofluoric acid and nitric acid in a concentration of 1:4;

depositing said $SiO_2$ is deposited at a rate of less than approximately 30 Angstroms per minute by filling said chamber with silane, oxygen and nitrogen at a temperature of between 200° C. and 300° C. and a pressure between approximately 0.4 to 1.4 Torr; and annealing said deposited oxide and said substrate at a temperature of approximately 550° C. in an atmosphere comprised substantially of inert gas.

* * * * *